US007288471B2

(12) United States Patent
Mackay

(10) Patent No.: US 7,288,471 B2
(45) Date of Patent: Oct. 30, 2007

(54) BUMPING ELECTRONIC COMPONENTS USING TRANSFER SUBSTRATES

(76) Inventor: John Mackay, 1566 Barberry Ct., San Jose, CA (US) 95121

( * ) Notice: Subject to any disclaimer, the term of this patent is extended or adjusted under 35 U.S.C. 154(b) by 274 days.

(21) Appl. No.: 10/989,107

(22) Filed: Nov. 15, 2004

(65) Prior Publication Data

US 2005/0150936 A1    Jul. 14, 2005

Related U.S. Application Data

(63) Continuation-in-part of application No. 10/643,766, filed on Aug. 18, 2003, now Pat. No. 7,007,833, which is a continuation-in-part of application No. 09/962,007, filed on Sep. 24, 2001, now Pat. No. 6,609,652, which is a continuation-in-part of application No. 09/273,517, filed on Mar. 22, 1999, now Pat. No. 6,293,456, which is a continuation-in-part of application No. 08/863,800, filed on May 27, 1997, now Pat. No. 5,988,487, application No. 10/989,107, which is a continuation-in-part of application No. 10/630,310, filed on Jul. 30, 2003, now abandoned, which is a continuation-in-part of application No. 09/962,007, filed on Sep. 24, 2001, now Pat. No. 6,609,652.

(60) Provisional application No. 60/520,701, filed on Nov. 17, 2003, provisional application No. 60/079,006, filed on Mar. 23, 1998, provisional application No. 60/079,221, filed on Mar. 24, 1998, provisional application No. 60/092,055, filed on Jul. 8, 1998.

(51) Int. Cl.
*H01L 23/488* (2006.01)
*H01L 21/77* (2006.01)

(52) U.S. Cl. ................ 438/613; 438/119; 438/459; 438/612; 438/977

(58) Field of Classification Search ............... 438/118, 438/119, 612, 613, 459, 977
See application file for complete search history.

(56) References Cited

U.S. PATENT DOCUMENTS

| 3,458,925 A | 8/1969 | Napier et al. ................. 29/578 |
| 3,520,055 A | 7/1970 | Jannett ........................ 29/830 |
| 3,569,607 A | 3/1971 | Martyak et al. ........... 174/68.5 |

(Continued)

OTHER PUBLICATIONS

Ball Grid Array Technology, Lau. McGraw-Hill, 1995 ISBN: 007036608X.
Ball Grid Array Technology, 1995, Lau, book published by McGraw-Hill.

*Primary Examiner*—Mary Wilczewski
*Assistant Examiner*—Pamela E Perkins
(74) *Attorney, Agent, or Firm*—Gerald E. Linden; Dwight A. Stauffer

(57) ABSTRACT

A method for forming solder bumps on an electronic component. Providing a transfer substrate having a plurality of solder balls, disposing the transfer substrate on the surface of the electronic component, heating to reflow the solder balls onto the electronic component; and removing the sacrificial substrate. The transfer substrate may comprise a sacrificial film and a metal layer patterned with a mask which is used to form solder balls on the transfer substrate. Or, the transfer substrate may comprise a sheet of silicone rubber having solder balls embedded at least partially in the sheet. A method of aligning a part being bumped with a transfer substrate, using a shuttle mechanism and an alignment film is disclosed.

14 Claims, 3 Drawing Sheets

U.S. PATENT DOCUMENTS

| | | | |
|---|---|---|---|
| 3,617,045 A | 11/1971 | DaCosta et al. | 269/21 |
| 3,719,981 A | 3/1973 | Steitz | 29/423 |
| 4,412,642 A | 11/1983 | Fisher, Jr. | 228/173 |
| 4,523,712 A | 6/1985 | Zado | 228/207 |
| 4,545,610 A | 10/1985 | Lakritz et al. | 29/589 |
| 4,622,239 A | 11/1986 | Schoenthaler et al. | 427/96 |
| 4,655,164 A | 4/1987 | Nelson et al. | 118/503 |
| 4,763,829 A | 8/1988 | Sherry | 228/124 |
| 4,856,185 A | 8/1989 | Baumgartner | 29/840 |
| 4,893,403 A | 1/1990 | Heflinger et al. | 29/840 |
| 4,898,320 A | 2/1990 | Dunaway et al. | 228/245 |
| 4,906,823 A | 3/1990 | Kushima et al. | 228/245 |
| 4,914,814 A | 4/1990 | Behun et al. | 29/843 |
| 4,950,623 A | 8/1990 | Dishon | 437/183 |
| 4,953,460 A | 9/1990 | Wojcik | 101/129 |
| 5,001,829 A | 3/1991 | Shelhorn | 29/840 |
| 5,014,162 A | 5/1991 | Clark et al. | 361/412 |
| 5,024,372 A | 6/1991 | Altman et al. | 228/248 |
| 5,039,628 A | 8/1991 | Carey | 437/183 |
| 5,046,161 A | 9/1991 | Takada | 357/69 |
| 5,079,835 A | 1/1992 | Lam | 29/840 |
| 5,108,027 A | 4/1992 | Warner et al. | 228/254 |
| 5,118,027 A | 6/1992 | Braun et al. | 228/180.2 |
| 5,118,029 A | 6/1992 | Fuse et al. | 228/198 |
| 5,137,845 A | 8/1992 | Lochon et al. | 437/183 |
| 5,141,212 A | 8/1992 | Beeding | 269/21 |
| 5,172,469 A | 12/1992 | Onda et al. | 29/762 |
| 5,197,655 A | 3/1993 | Leerssen et al. | 228/254 |
| 5,206,585 A | 4/1993 | Chang et al. | 324/158 P |
| 5,211,328 A | 5/1993 | Ameen et al. | 228/180 |
| 5,268,068 A | 12/1993 | Cowell et al. | 156/644 |
| 5,307,983 A | 5/1994 | Dudderar et al. | 228/180.22 |
| 5,310,574 A | 5/1994 | Holtmann | 427/58 |
| 5,346,118 A | 9/1994 | Degani et al. | 228/180.22 |
| 5,366,760 A | 11/1994 | Fujii et al. | 427/96 |
| 5,372,295 A | 12/1994 | Abe et al. | 228/123.1 |
| 5,381,848 A | 1/1995 | Trabucco | 164/102 |
| 5,388,327 A | 2/1995 | Trabucco | 29/830 |
| 5,395,040 A | 3/1995 | Holzmann | 228/254 |
| 5,438,020 A | 8/1995 | Grancher et al. | 437/183 |
| 5,439,164 A | 8/1995 | Hasegawa et al. | 228/194 |
| 5,449,108 A | 9/1995 | Park | 228/103 |
| 5,460,316 A | 10/1995 | Hefele | 228/39 |
| 5,480,835 A | 1/1996 | Carney et al. | 437/189 |
| 5,492,266 A | 2/1996 | Hoebner et al. | 228/248.1 |
| 5,535,936 A | 7/1996 | Chong et al. | 228/175 |
| 5,536,677 A | 7/1996 | Hubacher | 437/183 |
| 5,539,153 A | 7/1996 | Schwiebert et al. | 174/260 |
| 5,632,434 A | 5/1997 | Evans et al. | 229/44.7 |
| 5,658,827 A | 8/1997 | Aulicino et al. | 228/180.22 |
| 5,667,128 A | 9/1997 | Rohde et al. | 228/49.5 |
| 5,759,269 A | 6/1998 | Cutting et al. | 118/213 |
| 5,773,897 A | 6/1998 | Wen et al. | 257/778 |
| 5,782,399 A | 7/1998 | Lapastora | 228/41 |
| 5,806,753 A | 9/1998 | Bielick et al. | 228/248.1 |
| 5,829,668 A | 11/1998 | George et al. | 228/254 |
| 5,842,626 A | 12/1998 | Bhansali et al. | 228/180.22 |
| 5,877,079 A | 3/1999 | Karasawa et al. | 438/613 |
| 5,934,545 A | 8/1999 | Gordon | 228/191 |
| 5,950,908 A | 9/1999 | Fujino et al. | 228/248.1 |
| 5,988,487 A | 11/1999 | Mackay et al. | 228/254 |
| 6,008,071 A | 12/1999 | Karasawa et al. | 438/115 |
| 6,051,273 A | 4/2000 | Dalal et al. | 427/124 |
| 6,109,175 A | 8/2000 | Kinoshita | 101/170 |
| 6,126,059 A | 10/2000 | Mackay et al. | 228/9 |
| 6,153,505 A | 11/2000 | Bolde et al. | 438/613 |
| 6,293,456 B1 | 9/2001 | Mackay et al. | |
| 6,333,469 B1 * | 12/2001 | Inoue et al. | 174/260 |
| 7,007,833 B2 | 3/2006 | Mackay et al. | 228/44.7 |
| 2006/0035454 A1 | 2/2006 | Belanger et al. | |

\* cited by examiner

BUMPING ELECTRONIC COMPONENTS USING TRANSFER SUBSTRATES

CROSS-REFERENCE TO PENDING APPLICATIONS

This is a non-provisional filing of Provisional Patent Application No. 60/520,701 filed Nov. 17, 2003 by Mackay.

This is a continuation-in-part of commonly-owned, U.S. patent application Ser. No. 10/643,766 filed Aug. 18, 2003 now U.S. Pat. No. 7,007,833 by Mackay and Molinaro, (Status: Pub 2004/0110366 published Oct. 16, 2004), which is a continuation-in-part of:

Ser. No. 09/962,007 filed Sep. 24, 2001 (U.S. Pat. No. 6,609,652, issued Aug. 26, 2003; hereinafter referred to as the '652 patent) which discloses ball bumping substrates, particularly wafers;

which is a continuation-in-part of:

U.S. Ser. No. 09/273,517 filed Mar. 22, 1999 (U.S. Pat. No. 6,293,456, issued Sept. 25, 2001;

which is a continuation-in-part of each of:

U.S. Ser. No. 08/863,800 filed 27 May 1997 (U.S. Pat. No. 5,988,487, issued Nov. 23, 1999;

U.S. Ser. No. 60/079,006 filed 23 Mar. 1998;

U.S. Ser. No. 60/079,221 filed 24 Mar. 1998; and

U.S. Ser. No. 60/092,055 filed 8 Jul. 1998, all of which are incorporated in their entirety by reference herein.

This application is also a continuation-in-part of commonly-owned, U.S. patent application Ser. No. 10/630,310 filed Jul. 30, 2003 now abandoned, incorporated in its entirety by reference herein, which is a continuation-in-part of the aforementioned U.S. Ser. No. 09/962,007 filed Sep. 24, 2001 (U.S. Pat. No. 6,609,652, Aug. 26, 2003;

TECHNICAL FIELD OF THE INVENTION

The invention relates to methods of forming solder balls on ("bumping") circuitized substrates which are electronic components such as semiconductor devices (integrated circuit chips) and interconnection substrates, and to techniques for forming the solder balls on the electronic components.

BACKGROUND OF THE INVENTION

In recent years, flip-chip bonding techniques have increasingly been used to connect (bond) integrated circuit (IC) chips to interconnection substrates and to package substrates. In flip-chip bonding an IC chip component to an interconnection component such as ceramic interconnection substrate, a plurality (e.g., an array) of solder balls (also called "solder bumps") is formed on a face of a component, typically the IC chip component, and the bumped component is brought into a face-to-face relationship with the other component. The two components are then heated (such as in a furnace) to reflow (heat, then allow to cool) the solder bumps, thereby making electrical connections between respective terminals of the two components.

A "captured cell" technique is described in the '652 Patent. For example, FIG. 1 of the '652 Patent, reproduced as FIG. 1 herein, illustrates a technique 100 for forming solder balls on a surface of a substrate 102. The substrate 102 has number of pads 104 on its top (as viewed) surface. The pads 104 are typically arranged in an array, having a pitch (center-to-center spacing from one another). The substrate 102 is disposed atop a heater stage 106. A mask (stencil) 110 is provided. The mask 110 is a thin planar sheet of relatively stiff material, such as molybdenum, having a plurality of openings (cells) 112, each corresponding to a pad 104 whereupon it is desired to form a solder ball on the substrate 102. The mask 110 is placed on the top (as viewed) surface of the substrate 102 with the cells 112 aligned over the pads 104. The cells 112 in the mask 110 are filled with solder material 114. This is done in any suitable manner such as by smearing solder material on the top (as viewed) surface of the mask 110 and squeegee-ing the solder material 114 into the cells 112 of the mask 110. A pressure plate 120 is disposed onto the top (as viewed) surface of the mask 110. This holds the mask 110 down onto the substrate 102, and the substrate 102 down onto the heater stage 106. This also closes off the cells 112—hence, the terminology "captured cell". The heater stage 106 is heated up, typically gradually, to a temperature sufficient to cause the solder material in the cells 112 to melt (reflow). When the solder material melts, the individual solder particles will merge (flow) together and, due to surface tension, will try to form (and, typically, will form) a sphere. When the solder material re-solidifies, it assumes a general spherical or hemispherical shape. The mask 110 is then removed from the substrate 102.

A mechanism for shuttling a mask from a printing station to a product being ball bumped is described in the '652 Patent. For example, FIG. 10 of the '652 Patent, reproduced as FIG. 2 herein, illustrates an exemplary ball bumping machine 1000 having a base 202, a chuck 204 on the left side for holding a wafer 206 and a heater stage 208 on the right side. A mask 210 is held in a frame 212. The chuck 204 is disposed in chuck base 214. The heater stage 208 is disposed in a heater stage base 216. An elongate shuttle (carriage) mechanism 218 is pivotally attached to the base 202 at a point "P" between the chuck 204 and the heater stage 208. The frame 212 is held in a carrier 220 which is attached to the opposite (free) end of the shuttle mechanism 218. A motor 221 controls the position of the shuttle mechanism 218. The shuttle mechanism 218 can shuttle the mask 210 (i.e., the carrier 220) between the heater stage 208 on the right side (as shown) and the chuck 204 on the left side. The shuttle mechanism 216 pivots about the point "P". Cameras (not shown) are used to make alignments, for example of the mask 210 to the wafer 206. A set of holddown magnets 222, which preferably are electromagnets, selectively hold the chuck base 214 to the machine base 202. Similarly, a set of holddown magnets 222, which preferably are electromagnets, selectively hold the heater stage base 216 to the machine base 202. The carrier 220 is ferrous, or has ferrous "lands". A set of lift magnets 226, which preferably are electromagnets, selectively hold the carrier 220 to the heater stage base 216. Similarly, a set of lift magnets 228, which preferably are electromagnets, selectively hold the carrier 220 to the chuck base 214. In this manner, the mask can be brought down onto the heater stage, the magnets 226 turned on, the magnets 224 turned off, and the heater stage can be lifted by the shuttle mechanism 216. In other words, when the mask is shuttled, it can take the heater stage with it. Similarly, the mask can be brought down onto the chuck, the magnets 228 turned on, the magnets 222 turned off, and the chuck can be lifted by the shuttle mechanism 216.

BRIEF DISCLOSURE (SUMMARY) OF THE INVENTION

It is an object of the invention to provide an improved process for forming solder balls on electronic components.

The present invention advantageously utilizes various of the techniques set forth in the '652 Patent, as well as in other commonly-owned patents and pending applications, and presents a new method for ball bumping a substrate. All of the matter that is discussed in previous commonly-owned patents and pending applications is incorporated by reference herein.

According to the invention generally, a bump transfer substrate is prepared (bumped) with the proper alloy, bump size, and layout allowing the end user to transfer the solder (bumps) onto his products without high capital investments or large NRE (non-recurring) costs for small volumes. The technique is compatible with BGA (ball grid array), PCB (printed circuit board) pads, CSP (chip scale packaging), wafer level CSP, flip-chip, and the like.

The bump transfer substrate is essentially a sacrificial substrate. It may be bumped using the captured cell technique described in the '652 Patent (refer to FIGS. 1 and 2, above). Many advantages can accrue to first bumping a sacrificial substrate, then transferring the solder balls formed from the sacrificial substrate to a product.

According to the invention, a method for forming solder bumps on an electronic component comprises the steps of: providing a transfer substrate comprising a sacrificial substrate and plurality of solder balls; disposing the transfer substrate on the surface of the electronic component; heating to reflow the solder balls onto the electronic component; and removing the sacrificial substrate.

The transfer substrate may comprise a polyimide film, preferably substantially see-through, such as Kapton (™) covered with a layer of metal, such as copper. The layer of metal is patterned using a mask. The solder balls are formed on the transfer substrate, and this can be using the same mask.

The transfer substrate is urged against the electronic component, using a pressure plate or air pressure. A sheet of resilient material may be disposed between the pressure plate and the transfer substrate.

The sacrificial substrate may be removed either before or after cooling.

Alternatively, the sacrificial substrate comprises a sheet of silicone rubber; and the solder balls are at least partially, such as at least 50% embedded in the sheet of silicone rubber.

The silicone rubber with embedded solder balls embodiment of transfer substrate may be formed by: providing a blind hole mask having a planar substrate and a plurality of cells extending into a surface of the substrate; filling the cells with solder paste; reflowing the solder paste to form solder balls; encapsulating the mask with a curable resilient material (silicone rubber); allowing the curable material to cure, forming a sheet; and removing the curable resilient material from the mask, with the solder balls least partially embedded therein.

According to the invention, a method of aligning a transfer substrate to a product being bumped comprises the steps of: providing a machine having first a chuck for holding the product being bumped, a second chuck for holding a transfer substrate, and frame for holding an alignment film; shuttling the alignment film to the product being bumped, and aligning the product being bumped; and shuttling the alignment film to the transfer substrate, and aligning the transfer substrate.

Then, for bumping the product, removing the alignment film, shuttling the transfer substrate to the product being bumped, urging the transfer substrate against the product being bumped, supplying heat to reflow solder balls from the transfer substrate to the product being bumped, and releasing the transfer substrate.

Other objects, features and advantages of the invention will become apparent in light of the following description thereof.

BRIEF DESCRIPTION OF THE DRAWINGS

Reference will be made in detail to preferred embodiments of the invention, examples of which are illustrated in the accompanying drawings. The drawings are intended to be illustrative, not limiting. Although the invention will be described in the context of these preferred embodiments, it should be understood that it is not intended to limit the spirit and scope of the invention to these particular embodiments.

The structure, operation, and advantages of the present preferred embodiment of the invention will become further apparent upon consideration of the following description taken in conjunction with the accompanying drawings (FIGs).

DETAILED DESCRIPTION OF THE INVENTION

Figure 1:
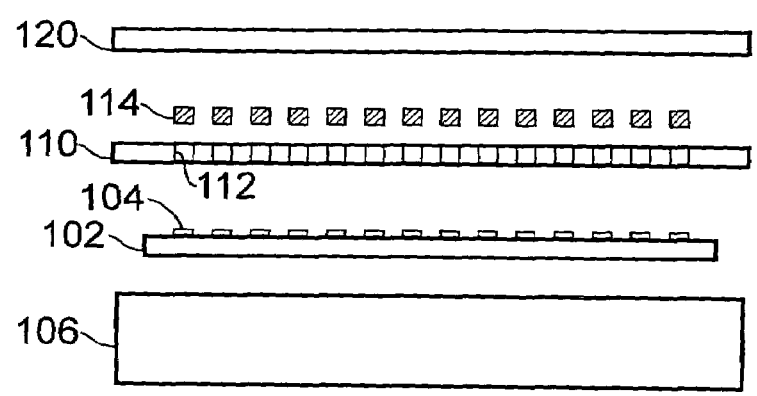
FIG. 1 is an exploded cross-sectional view of a method and apparatus for forming solder balls on substrates, as set forth in FIG. 1 of the '652 Patent.

U.S. Pat. No. 5,988,487 discloses methods for forming solder bumps on integrated circuit chips (and other similar circuitized units). A screening stencil is laid over the surface of the substrate and solder paste material is deposited into the stencil's apertures with a screening blade. The stencil is placed in such a manner that each of its apertures is positioned over a substrate pad, upon which a solder bump is to be formed. Next, a flat pressure plate is laid over the exposed top surface of the stencil, which creates a fully enclosed or "captured", cell of solder paste within each stencil aperture. Then, with the stencil and plate remaining in place on top of the substrate, the substrate is heated to a temperature sufficient to reflow the solder paste material. After reflow, the substrate is cooled, and the pressure plate and stencil are thereafter removed, leaving solder bumps on the substrate. The use of the pressure plate ensures the proper formation of the solder bumps at high densities of solder bumps (i.e., high densities corresponding to small solder bump sizes and small pitch distances between solder bumps).

In U.S. Pat. No. 5,988,487, a method of forming solder bump structures on corresponding pads of a substrate comprises the steps of:

(a) laying a stencil over the surface of the substrate, the stencil having apertures, said stencil being laid in such a manner that an aperture is positioned over a substrate pad;

(b) screen depositing a solder paste material into the stencil apertures;

(c) thereafter laying a flat plate over the exposed top surface of the stencil; and (d) thereafter heating the substrate with the stencil and plate on top thereof to a temperature sufficient to reflow the solder paste material.

In U.S. Pat. No. 5,988,487, a method of forming solder bump structures on corresponding pads of a substrate further comprises the steps of:

(e) thereafter lowering the temperature of said substrate to a temperature point below 95% of the melting point of the reflowed solder, as measured in degrees Kelvin, and above 80% of said melting point; and (f) thereafter lifting the plate and stencil from said substrate at this temperature point.

In U.S. Pat. No. 5,988,487, a method of forming solder bump structures on corresponding pads of a substrate further comprises the steps of:

(a') the stencil having apertures which correspond one-to-one with corresponding pads of the substrate.

U.S. Pat. No. 6,609,652 discloses a mask (stencil) having cells (openings) is disposed on a surface of a heater stage, and is then filled (printed) with solder paste. Then a substrate is assembled to the opposite side of the mask. Then the solder paste is reflowed. This may be done partially inverted. Then the mask is separated from the substrate, either before or after cooling. Solder balls are thus formed on the substrate, which may be a semiconductor wafer. A method for printing the mask with solder paste is described.

In U.S. Pat. No. 6,609,652 a ball bumping machine comprises a machine base, a chuck for holding a substrate, a heater stage, and a frame for holding a mask, and the ball bumping machine is characterized by:

the chuck is disposed on one side of the machine base;
the heater stage is on an opposite side of the machine base; and
means for shuttling the frame between the heater stage and the chuck.

U.S. patent application Ser. No. 10/643,766 (Pub 2004/0110366; discloses a mask (stencil) having cells (openings) is disposed on a surface of a heater stage, and is then filled (printed) with solder paste. Then a substrate is assembled to the opposite side of the mask. Then the solder paste is reflowed. This may be done partially inverted. Then the mask is separated from the substrate, either before or after cooling. Solder balls are thus formed on the substrate, which may be a semiconductor wafer. A biased chuck urges the substrate into intimate contact with the mask. A method for printing the mask with solder paste is described. Methods of forming high aspect ratio solder bumps (including balls and reflowable interconnect structures) are described.

In U.S. patent application Ser. No. 10/643,766 (Pub 2004/0110366; a method for forming solder bumps on a substrate having a plurality of pads on a surface thereof, comprises:

providing a mask having a first surface and a second surface, and a plurality of cells extending from the first surface at least partially through the mask to the second surface thereof; filling the cells with solder paste; disposing the substrate in a biased chuck assembly;
disposing the mask on the surface of the substrate with the first surface of the mask adjacent the surface of the substrate; urging the substrate into positive contact with the mask so as to maintain substantially intimate contact between the first surface of the mask and the surface of the substrate;
reflowing the solder paste; and
separating the substrate from the mask.

In U.S. patent application Ser. No. 10/643,766 (Pub 2004/0110366; a chuck assembly for holding a semiconductor wafer in intimate contact with a mask, comprising a rigid, generally planar chuck base, is characterized by:

a central recess extending into the stage from a top surface thereof, said recess sized and shaped to receive a generally planar, flexible diaphragm, said diaphragm extending across the recess.

The above inventions Ser. Nos. 08/863,800, 09/962,007, 10/643,766, relate to methods of forming solder balls on substrates which are electronic components such as semiconductor devices (integrated circuit chips) and interconnection substrates, and to apparatuses for forming the solder balls on the electronic components. Very generally, and this was done "directly" by filling cells of a mask with solder paste, placing the filled mask on the electronic component being bumped, reflowing the solder paste, and removing the mask. (Many more specifics such as closed cell are involved.)

The present invention advantageously utilizes many of the techniques disclosed in Ser. Nos. 08/863,800, 09/962,007, 10/643,766, but rather than bumping an electronic component directly, a "sacrificial substrate" is bumped, and the bumped sacrificial substrate, or "transfer substrate" is used to bump the electronic component. As used herein, the verb "bump" means to form solder balls on, and the noun "bump" means a solder ball.

Basic Transfer Substrate Manufacturing, Generally

According to the invention, generally, rather than bumping an electronic component, first a sacrificial substrate (bump transfer substrate) is bumped, then the bumps (solder balls) are transferred to the electronic component—namely, to corresponding pads on the electronic component.

The bump transfer substrate may be a film sheet, wafer, or substrate which is coated with a base thin film (layer) of metal. The film can be a continuous (not patterned), blanket deposition. Utilizing the a wafer bumping process, such as disclosed in the '652 Patent, a very thin layer of copper, or equivalent can be soldered to. (As described below, the layer gets patterned.) This is due to the unique methods of interference liquid sphere attachment described in the '652 Patent. This allows the bump to consume this thin film and release from the substrate when the user heats to the suggested re-flow profile.

A wafer bump mask is produced from etching, laser cutting, or additive manufacturing. It is noted that this mask when used with the method described in the '652 Patent, hole size variations and positions do not require exact precision. The final product however produces excellent bump height uniformity, and a high tolerance for mismatches in material expansions. The typical mask costs are equivalent to a SMT (surface mount technology) mask.

The bump mask can be similar to the masks that were used Ser. Nos. 08/863,800, 09/962,007, 10/643,766, for bumping the electronic component. Here, the mask is used to form bumps on the transfer substrate, but first can be used to pattern the metal film (layer) on the transfer substrate, thereby advantageously serving a "dual" purpose.

This bump mask is then used to photo process the thin film (metal layer) into pad defined patterns. (The pads are processed using the bump mask as a shadow mask for photoresist coat, followed by etching.) It may also be used with liquid photo-imageable solder masks, as a mask defined pad pattern. This typically depends on the bump size and pitch requirements. This greatly reduces processing costs requiring only low cost laser film masks produced form auto cad, or Gerber files.

This produces a transfer substrate with the bump(s) attached, flux coated, ready to be transferred/released at the point of use. This method produces transfer substrates for about $500 tooling cost and substrate cost of $5-7 and turn around times of 2-3 days are possible. Allowing a substantial markup while providing customers exceptional cost savings and time to market solutions.

The process of the present invention has few limitations. Any ball size or alloy can be produced, this bridges the gap presently experienced by the industry as ball drop techniques are limited to about 10 mils and flip chip manufactures mostly have a hard time producing ball sizes greater than 5 mils.

EMBODIMENT 1

Fixture-Less Transfer

Figure 3:
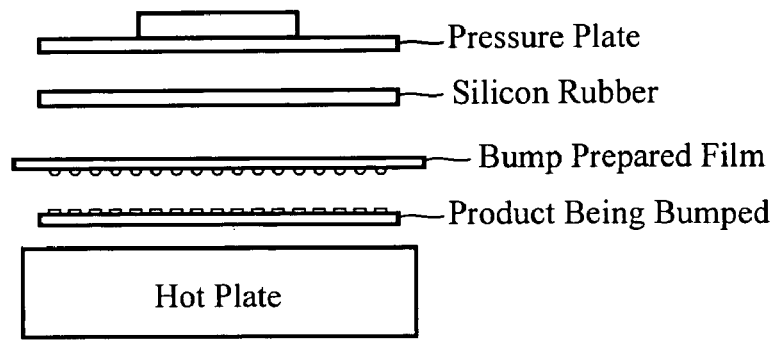
FIG. 3 is a cross-sectional view of a fixtureless transfer mechanism, according to the invention.

Reference FIG. 3. Fixture-less transfers utilize a transfer substrate which is a film, which is metallized. A typical film substrate material is polyimide material (such as Kapton-™), having a thickness of 0.003 in, and is preferably transparent or translucent (the sacrificial substrate is substantially see-through). The film itself is a "sacrificial film substrate". A metal film such as copper (material) is deposited on one surface of the film substrate. The metal thickness is in the range of 500-3000 Å, such as approximately 1000 Å.

First, the transfer substrate (metallized film substrate) is patterned (such as by using the bump mask, as described above) and bumped (again, using the bump mask). Typically, this would be done bump-up (bumping the top, metallized surface of the transfer substrate). The transfer substrate (bumped film substrate) can be set aside until needed, or shipped to a customer. This is one of the advantages of the invention. The bumping service provider does not necessarily need to handle (and risk damaging) the product (electronic component). The transfer substrate can be fluxed, now or later.

The thickness of the metal film on the film substrate should be thick enough that it is not consumed in the step of bumping the film substrate. Later, when reflowing the bumps from the transfer substrate to the electronic component, as described hereinbelow, the metal film will be consumed, thereby also releasing the balls from the film substrate, so it cannot be too thick. Exemplary ranges for the dimensions are set forth above.

Then, the bump prepared film (transfer substrate) and flux is inverted (bump-down) and aligned visually through the film with an underling product being bumped (electronic component). Typically, the flux is tacky enough to maintain alignment between the transfer substrate and the electronic component. This can be done on a hot plate (not yet heated, of course). If visual alignment is not possible, other conventional alignment means can be employed.

Next, a cover plate stack is placed on the top of the aligned film. The cover plate stack comprises;
- a sheet of resilient material, such as conformal silicone rubber (silicone rubber is a synthetic elastomer made from a cross-linked polymer which is reinforced with silica); and
- a pressure plate—such as a quartz disk.

(Silicone rubber is a synthetic elastomer made from a cross-linked polymer which is reinforced with silica.)

The conformal silicone rubber suitably has a thickness of from one-eight to one-quarter of an inch (0.125-0.250 inches). This sheet of silicone rubber serves various purposes:
- it acts as a thermal barrier so that the pressure plate does not "sink" heat which is being provided by the hot plate (FIG. 3) to reflow the solder balls on the transfer substrate; and
- is equalizes pressure and reduces stress concentrations such as may result from an uneven topology across the top surface of the product (electronic component) being bumped (FIG. 3)

It is within the scope of the invention that a manifold delivering air pressure to the back side (top, as viewed in FIG. 3) of the silicone rubber is used in lieu of a pressure plate to hold the transfer substrate (bump prepared film) securely to the product being bumped (electronic component). The use of air pressure rather than a pressure plate is also pertinent to Embodiment 3, discussed hereinbelow. The pressure plate (or air pressure mechanism) urges the transfer substrate against the electronic component.

Next, the cover plate stack (pressure plate and silicone rubber) is placed atop the product/film on a cool (not yet heated) hot plate. Then the hot plate is heated to reflow the solder bumps on the transfer substrate). As mentioned hereinabove, this is when the copper film (pads under the balls) on the transfer substrate gets consumed, releasing the balls.

In this example, heating takes place through the electronic component, and should therefore be controlled so as to not damage the component. Some of the techniques described in Ser. Nos. 08/863,800, 09/962,007, 10/643,766 could be employed to minimize heating the electronic component.

Then the cover plate stack (pressure plate, silicone rubber; or pressure manifold and silicone rubber) is removed. This can be done before or after cooling.

Then the sacrificial film substrate can be peeled off, either hot or cold (before or after cooling).

If the sacrificial film substrate is removed before cooling, nice spherical will result bumps on the electronic component (product being bumped).

If the sacrificial film substrate is removed after cooling, there is no need to handle hot materials. However, bump distortions (for example, flat top bumps) may occur. But, as may be desirable to some clients, a second re-flow would reform (reflow) the bumps as spheres, if required.

With respect to bumping the electronic component, the process of FIG. 3 could be done inverted (turn the drawing sheet upside down to visualize this), as discussed for example in Docket M-3.

EMBODIMENT 2

Precision Tool Transfer

Figure 2:
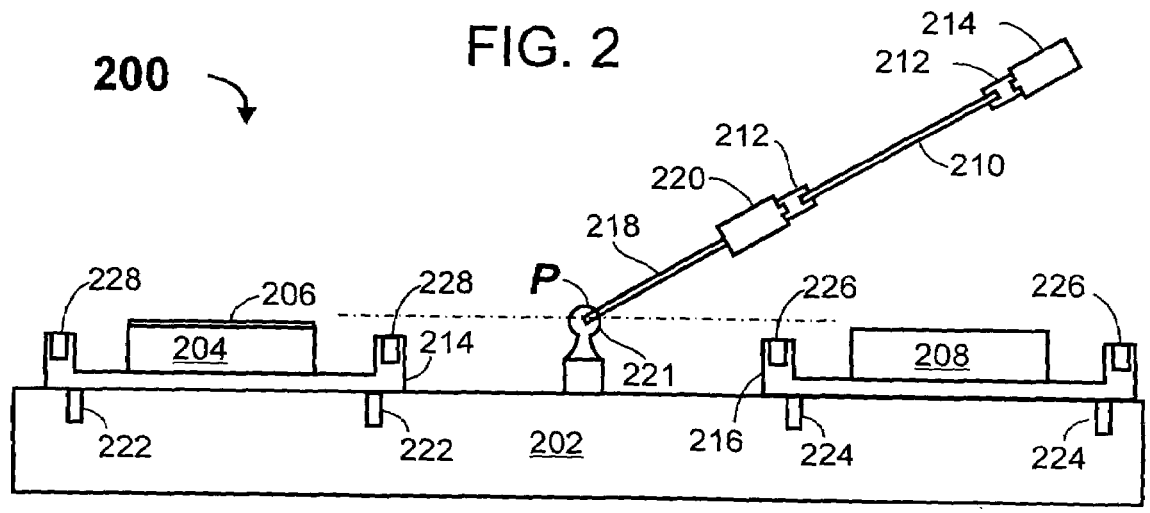
FIG. 2 is a schematic side view of a ball bumping machine, as set forth in FIG. 10 of the '652 Patent.
Figure 4:
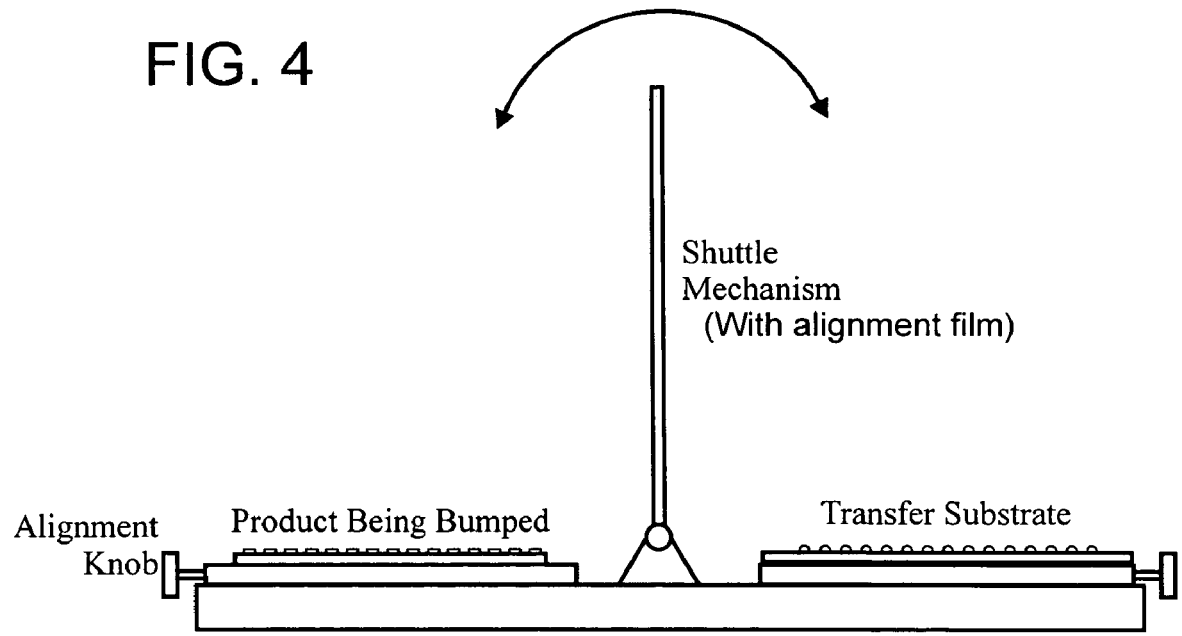
FIG. 4 is a cross-sectional view of a precision tool transfer mechanism, according to the invention.

Reference FIG. 4. A precision tool modeled after (based on, substantially similar to, functionally comparable to) the FIG. 10 of the '652 Patent (FIG. 2, herein) would perform all of the needed functions to transfer bumps from transfer (sacrificial) substrates onto products (electronic components). This would include alignment functions, contact and re-flow, and separation.

The unit has two chucks one for holding the product to be soldered (bumped) and one for holding the transfer substrate, both have flex heater inserts. A frame (in the shuttle mechanism) holds the film for alignment. This is copy of the film used to manufacture the mask and costs about $10-$20.

As in the '652 Patent, means are provided (shuttle mechanism) for shuttling the frame between two positions—namely, between the product being bumped and the transfer substrate.

The alignment film is rotated (shuttled) to the product being bumped and alignment using knobs is accomplished. The film is then rotated (shuttled) to the transfer substrate which is then aligned.

The alignment film is then removed and the transfer substrate (in any of the embodiments set forth herein) is rotated (shuttled) directly over the product. Pressure is then supplied to mate the bumps on the transfer substrate to the pads on the electronic component. (The transfer substrate is urged against the product being bumped). Heat is supplied, solder balls are reflowed onto the pads of the product being bumped, and the transfer substrate is released.

The system can then separate and cool or cool in place as desired.

Using the alignment film provides a cheap way using no cameras to achieve appropriate alignments. A low cost laser film is produced. The operator loads this into the frame that swings back and forth between the transfer substrate and the wafer (product being bumped), a visual alignment is made at wafer, then swing back to the transfer substrate and align, then remove the alignment film and swing (shuttle) the transfer substrate to the wafer and heat (reflow), then swing the transfer substrate away (before or after cooling, as described hereinabove). Also, by using the alignment film, the transfer substrate does not need to be transparent (e.g., kapton), as in the previous embodiment.

EMBODIMENT 3

Silicone Rubber Transfer Substrate

In this embodiment, a "blind hole" mask is used. A blind hole mask is discussed, for example, in the '652 Patent. In the '652 patent (see FIGS. 5A and 5B), cells (512) in the blind hole mask (520) were filled with solder paste (514), then reflowed with the electronic component (302) in place. The mask material is suitably molybdenum (moly).

In this embodiment of the present invention, generally, the solder is reflowed in the blind hole mask, forming solder balls, the solder balls are captured to a substrate, then later transferred to the electronic component (product being bumped).

Figure 5A:
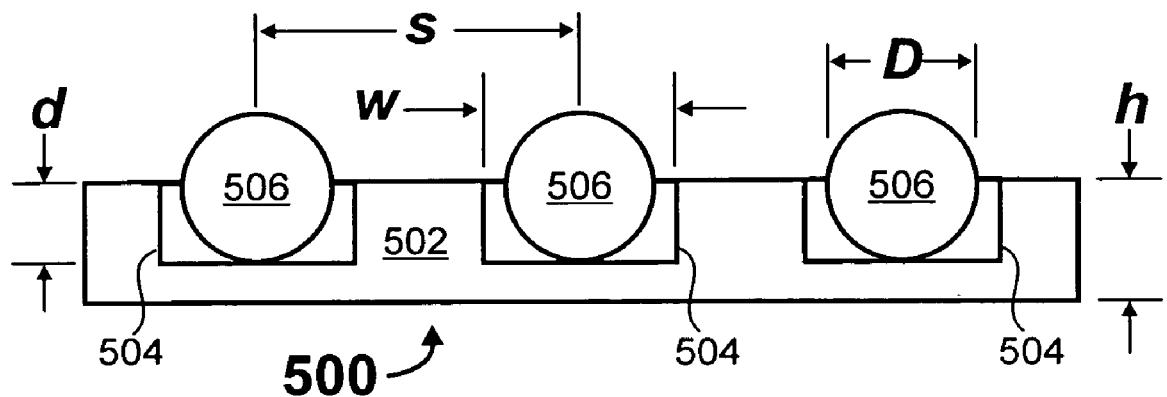
FIGS. 5A, 5B and 5C are cross-sectional views of an embodiment of the invention.

With reference to FIG. 5A, first a blind hole mask 500 is created which is a planar substrate 502 having two opposite sides (top and bottom, as viewed), and a plurality of holes (cells) 504 extending into the substrate from on side (surface) thereof towards the other side thereof. Next, the holes are filled with solder paste, and reflowed to form solder balls 506. The substrate 502 is suitably molybdenum (moly). The solder will not wet to the moly. Suitable exemplary dimensions are:

h, thickness of the mask, approximately 8 mils (0.008 inches)
d, depth of the cells, approximately 6 mils
w, cross-dimension of a cell, approximately 16 mils
s, spacing (pitch) of the cells, approximately 20 mils
D, diameter of a solder ball, approximately 11.8 mils (0.3 mm)

A word about the figure (FIG. 5A). In reality, the cells 504 are not so square as illustrated. Actually, they are rounded, as a result of etching. Including dished out somewhat at the bottom. This is normal.

In any case, it will be noted that the resulting solder balls 506 stick up, significantly, out of the cells 504 in the mask 500. It should also be remembered that when solder paste forms solder balls, about half the original volume is lost due to volatiles etc.

Figure 5B:
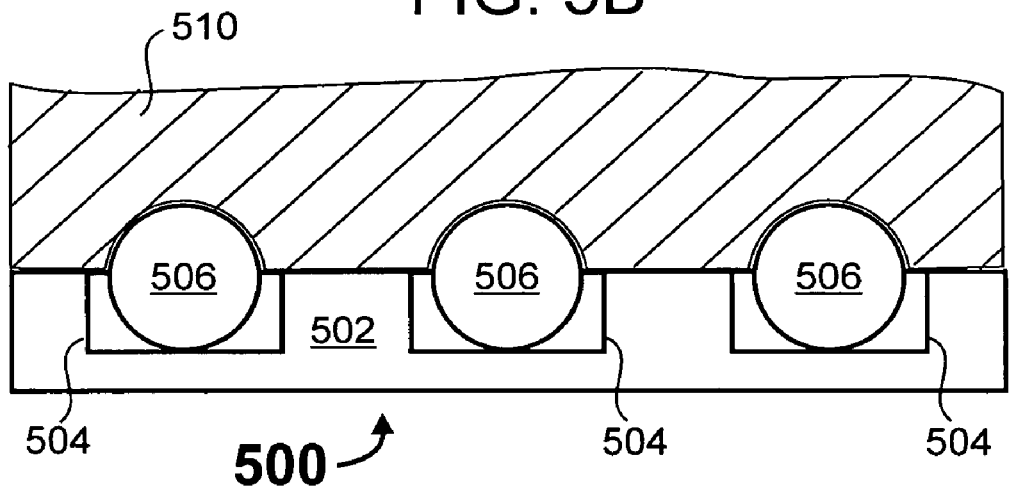

FIG. 5B shows a next step. The blind hole mask 500 was used to create individual, organized spheres (solder) 506 of a well-defined size at a well-defined pitch. It should then be allowed to cool down, but can still be warm. As shown here, the front surface of the mask 500 is encapsulated a curable material 510, such as silicone rubber, which is allowed to cure. The silicone rubber forms a sheet. The top surface is shown a little wavy just to indicate that when applied, it is a liquid, and when cured it will be generally planar. Any curable material which can later be applied in substantially liquid form, cure to a resilient sheet, and can be peeled away will work here. RTV (room temperature vulcanize) silicone rubber materials are a good choice.

A word about the figure (FIG. 5B). In reality, the silicone rubber material 510 would enter the cells 504 in the gap between the spheres 506 and the walls of the cell 504. For example, rather than encompassing only about half of the sphere, the silicone rubber would encompass approximately 75% of the sphere—namely, more than half (50%) but not 100%. 60%-80% is adequate. (The figure is highly stylized. In reality, the bottoms of the cells are dished, and the solder balls will always be poking at least slightly out of the rubber sheet.)

Figure 5C:
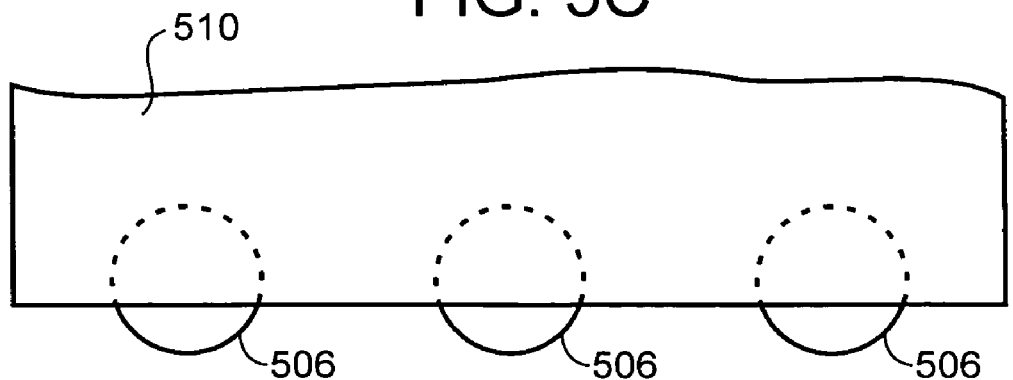

Then, as shown in FIG. 5C the sheet of cured silicone rubber 510 has been peeled away (removed) from the mask (not shown in this figure), and it has solder balls 506 sticking out of its surface, the solder balls being of a well-defined size at a well-defined pitch. (The solder balls stick (adhere lightly) to the sheet of silicone rubber, also the silicone rubber captures the balls by encompassing more than half of the sphere, yet is removable.) This is a saleable product, like the other ball bumped transfer substrates discussed herein, ready to ship to an electronic component manufacturer who wants to bump their product without significant equipment costs and problems.

A word about the figure (FIG. 5C). This presents a more realistic view where the balls 506 are about 75% buried (only 25% poking out) of the silicone rubber sheet 510.

The sheet 510 with balls 506 is then used as a transfer substrate, as described above. First aligned, using any suitable alignment technique, as described above. Then held securely to the product being bumped using either a pressure plate or an air pressure manifold, as described above. Then remove the rubber. (Silicone rubber will peel away easily, because it is resilient, and where it wraps around the equators of the spheres, it will yield.) Particularly with this method (silicone rubber sheet with solder balls embedded), the use of air pressure (rather than a solid pressure plate) offers constant force even on non-flat substrates (being bumped).

This method (solder balls embedded in a sheet of silicone rubber) does not require a thin films on the transfer substrate, as in the previously-described embodiments.

In all embodiments, the solder wets to pads on the product being bumped, and said pads should of course have UBM (under bump metal) which is not consumed when reflowing the solder balls from the transfer substrate to the product being bumped.

The invention is useful for virtually any size and arrangement of balls. Custom arrangements can be formed. Or, standard pitch grids can be mass-produced, for example:

0.3 mm balls on 0.5 mm pitch (such as for chip scale)
5 mm balls on 8 mm pitch (such as for BGA package)

Although the invention has been illustrated and described in detail in the drawings and foregoing description, the same is to be considered as illustrative and not restrictive in character—it being understood that only preferred embodiments have been shown and described, and that all changes and modifications that come within the spirit of the invention are desired to be protected. Undoubtedly, many other "variations" on the "themes" set forth hereinabove will occur to one having ordinary skill in the art to which the present invention most nearly pertains, and such variations are intended to be within the scope of the invention, as disclosed herein.

What is claimed is:

1. A method for forming solder bumps on an electronic component comprising the steps of:
    providing a transfer substrate comprising a sacrificial substrate and plurality of solder balls;
    disposing the transfer substrate on the surface of the electronic component;
    heating to reflow the solder balls onto the electronic component; and
    removing the sacrificial substrate;
    wherein:
    the sacrificial substrate comprises a sheet of silicone rubber; and
    the solder balls are at least partially embedded in the sheet of silicone rubber.

2. The method of claim 1, wherein:
    the transfer substrate comprises a polyimide film covered with a layer of metal.

3. The method of claim 2, wherein:
    the film is Kapton (tin).

4. The method of claim 2, wherein:
    the metal is copper.

5. The method of claim 2, wherein:
    the layer of metal is patterned using a mask.

6. The method of claim 5, wherein:
    the solder balls are formed on the transfer substrate using the mask.

7. The method of claim 1, wherein:
    the solder balls are formed on the transfer substrate using the mask.

8. The method of claim 1, wherein:
    the sacrificial substrate is substantially see-through.

9. The method of claim 1, further comprising:
    prior to heating, urging the transfer substrate against the electronic component.

10. The method of claim 9, further comprising:
    urging the transfer substrate against the electronic component using a pressure plate and a sheet of resilient material disposed between the pressure plate and the transfer substrate.

11. The method of claim 1, wherein:
    the sacrificial substrate is removed before cooling.

12. The method of claim 1, wherein:
    the solder balls are at least 50% embedded in the sheet of silicone rubber.

13. A method of forming a transfer substrate for forming solder bumps on an electronic component comprising the steps of:
    providing a blind hole mask having a planar substrate and a plurality of cells extending into a surface of the substrate;
    filling the cells with solder paste;
    reflowing the solder paste to form solder balls;
    encapsulating the mask with silicone rubber;
    allowing the silicone rubber to cure, forming a sheet comprising a sacrificial substrate ; and
    removing the sacrificial substrate from the mask, with the solder balls least partially embedded therein.

14. The method of claim 13, wherein:
    the solder balls are at least 50% embedded in the sacrificial substrate.

* * * * *